United States Patent
Buettner et al.

(10) Patent No.: US 7,495,949 B2
(45) Date of Patent: Feb. 24, 2009

(54) ASYMMETRICAL RANDOM ACCESS MEMORY CELL, MEMORY COMPRISING ASYMMETRICAL MEMORY CELLS AND METHOD TO OPERATE SUCH A MEMORY

(75) Inventors: Stefan Buettner, Sindelfingen (DE); Torsten Mahnke, Stuttgart (DE); Wolfgang Penth, Herrenberg (DE); Otto Wagner, Aldtorf (DE)

(73) Assignee: International Business Machines Corporation, Armonk, NY (US)

( * ) Notice: Subject to any disclaimer, the term of this patent is extended or adjusted under 35 U.S.C. 154(b) by 101 days.

(21) Appl. No.: 11/669,369

(22) Filed: Jan. 31, 2007

(65) Prior Publication Data

US 2007/0189061 A1    Aug. 16, 2007

(30) Foreign Application Priority Data

Feb. 10, 2006    (EP)    .................................. 06101534

(51) Int. Cl.
*G11C 11/00*    (2006.01)
(52) U.S. Cl. .............. 365/154; 365/189.05; 365/230.06
(58) Field of Classification Search ................ 365/154, 365/189.05, 230.06
See application file for complete search history.

(56) References Cited

U.S. PATENT DOCUMENTS 6,111,780 A * 8/2000 Bertin ......................... 365/154

7,158,402 B2    1/2007 Houston

FOREIGN PATENT DOCUMENTS

EP    1505607 A1    2/2005

OTHER PUBLICATIONS

Navid Azzi, Farid N. Najm, Andreas Moshovos, Low-Leakage Asymmetric-Cell SRAM, Aug. 2003, vol. 11 No. 4, IEEE, Canada.
Leland Chang, David M. Fried, Jack Hergenrother, Jeffrey W. Sleight, Robert H. Dennard, Robert K. Montoye, Lidija Sekaric, Sharee J. McNab, Anna W. Topoi, Charlotte D. Adams, Kathryn W. Guarini and Wilfried Haensch, Stable SRAM Cell Design for the 32 nm Node and Beyond, 2005 Symposium on VLSI Technology Digest of Technical Papers, T.J. Watson Research Center, New York.

* cited by examiner

*Primary Examiner*—Richard Elms
*Assistant Examiner*—Nam Nguyen
(74) *Attorney, Agent, or Firm*—W. Riyon Harding

(57) ABSTRACT

An asymmetrical random access memory cell (1) including cross coupled inverters (2, 3) which are driven at their nodes (22, 32) by separate bit-lines (blt, blc) of a pair of complementary bit-lines, which are connected via a pass-transistors (21, 31), wherein said cross coupled inverters (2, 3) have different switching thresholds and exhibit asymmetrical physical behaviours, wherein an additional pass-transistor (4) is provided in series to one of the pass-transistors (21) between one of the nodes (22) and its dedicated bit-line (blc). Further the invention relates to a random access memory including such memory cells and to a method of operating such a memory.

11 Claims, 5 Drawing Sheets

ASYMMETRICAL RANDOM ACCESS MEMORY CELL, MEMORY COMPRISING ASYMMETRICAL MEMORY CELLS AND METHOD TO OPERATE SUCH A MEMORY

CROSS REFERENCES TO RELATED APPLICATIONS

This application is related to German Patent Application No. EP06101534, filed Feb. 10, 2006. This application is also related to U.S. patent application Ser. No. 11/623,443, filed Jan. 16, 2007 assigned to the present Assignee.

FIELD OF THE INVENTION

This invention relates to an asymmetrical random access memory cell comprising cross coupled inverters and it relates to a memory comprising such cells, and further the invention relates to a method to operate such a memory.

BACKGROUND OF THE INVENTION

The increasing tightness of the chip structures leads to more and more increasing noise problems while determining the state of a Symmetrical Random Access Memory Cell (SRAM) according to the state of the art or while writing such a cell. Furthermore negative side effects on neighboring cells occur.

The standard 6T (six transistor) SRAM cell suffers for example from instability during read operations. This has a significant impact on the yield of modern microprocessor fabrication since modern microprocessors are provided with large memories on the microprocessor chip. The issue is expected to become even more severe in future semiconductor technology generations.

With the symmetrical 6T cell, instability is likely to occur when the cell's dedicated wordline is active for read operation, thus establishing conductive paths between the two complementary bit-lines and the cell-internal nodes respectively.

Known solution approaches are cells with bigger devices or more devices, especially 8T or 10T cell approaches. But because of the needed massive usage of cells the area consumption of a cell is essential. So such approaches have an inevitable drawback.

There was an effort to improve the stability by selectively increasing the drive strength of the p-channel pull-up transistors, but this degrades the write performance in an intolerable way.

Another approach is to increase the supply voltage used together with 6T SRAMs to improve the stability by raising the supply voltage as known in the sate of the art. The major drawback of such an approach lies therein that due to the energy dissipation problem the higher voltage can only be realized within the range of the SRAM cells, not however in the logic surrounding and controlling the memory cells. Therefore such solutions have to operate with a least two different supply voltages on the same chip. The larger the voltage raise for the cells is selected, the more difficult it will be to write the cells.

Further a second supply voltage must be generated and distributed via extra structures on the chip. This represents a substantial negative cost factor. Another difficulty lies therein that decreasing supply voltages are intended to be used, whereby occurring disturbing fluctuations in the supply voltage levels could hardly be prevented.

European patent application EP1505607 A1 proposes an asymmetric static random access memory device, which is described to reduce bit-line leakage, wherein the memory comprises a column having opposing bit lines, asymmetric memory cells spanning the opposing bit lines in alternating orientations, and a sense amplifier. The sense amplifier includes sensing circuitry configured to sense values stored in the cells and switching circuitry configured to apply signals to the sensing circuitry as a function of the orientations. A major drawback on this technique is the need of a very technology-specific sense amplifier.

The article by Navid Azizi, Farid N. Najm, Andreas Moshovos, titled "Low-Leakage Asymmetric-Cell SRAM", from IEEE TRANSACTIONS ON VERY LARGE SCALE INTEGRATION (VLSI) SYSTEMS, VOL. 11, NO. 4, AUGUST 2003, p. 701-715 describes asymmetric SRAM cells that reduce leakage power in caches while maintaining low access latency. A major drawback on this technique is the need of a complex sense amplifier, in combination with dummy bit-lines, to produce read times which are on par with conventional symmetric cells.

Therefore a need exists to avoid the extensive and therefore expensive increase of use of space on the chip in order to overcome the noise problems.

SUMMARY OF THE INVENTION

It is therefore an object of the invention to provide a memory cell that is improved over the prior art and a memory with a plurality of said memory cells together with a method to operate such a memory.

The advantages of the present invention is achieved by an asymmetrical random access memory cell comprising cross coupled inverters which are driven at their nodes by separate bit-lines of a pair of complementary bit-lines, which are connected via a pass-transistors, wherein said cross coupled inverters have different switching thresholds providing asymmetrically physical behaviours, wherein an additional pass-transistor is provided in series to one of the pass-transistors between one of the nodes and its dedicated bit-line.

A major benefit of the invention is that a second supply voltage as described above is not needed. Further another benefit is that the chip surface needed for the read/write-circuitry is smaller since said circuitry is much less timing sensitive and as a result less complex. Thereby the stability is improved without deteriorating the write process as it is the case in the described known approach with increased voltages.

The memory cell according to the invention allows more independent read and write operations of the memory cell and optimization of that operations, since only one node can be read out avoiding forcing of the complementary bit-line.

Advantageously the inverter with its gate connected to the pass transistor dedicated to conduct the read signal, is made with a higher threshold by proper rationing the device sizes of the p- to n-devices and/or a n-device with a higher device threshold voltage Vt, and/or a n-device with thicker oxide. This leads to increased stability during a read. The yield of good cells is increased substantially for chips with large memories like processor chips. Alternatively the other inverter can be changed in a similar manner. For example, the Vt could be lowered.

The additional pass-transistor ensures that increased stability is achieved, while the read and write schemes are greatly simplified even in arrays with bit-line selection. Only one additional transistor is needed thus limiting the increase in the size of the cell. The asymmetrical 7T cell is an advantageous solution in small or medium size arrays where the cell area is less critical than the complexity of the surrounding circuitry.

In a preferred embodiment of the invention the additional pass-transistor is driven by a write select line, which drives the additional pass-transistor during a write operation of the asymmetrical random access memory cell. The additional pass-transistor is not driven during a read operation of the asymmetrical random access memory.

In another preferred embodiment of the invention a permanent connection to ground or to the supply voltage is present instead of a complement bit-line.

The advantages of the invention are also achieved by a random access memory comprising a plurality of the asymmetrical random access memory cells, which are arranged in columns and rows, and a control circuit is provided controlling the additional pass-transistor.

A very important benefit of the invention lies therein that the normal signal voltages can be used and that there is no need of excessive additional circuitry to evaluate the state of the memory cell. The bit-lines stay symmetrical and common designs can be used.

The advantages of the invention are also achieved by a method to operate a random access memory, wherein during a write-cycle of the memory cell said circuitry drives the additional pass-transistor so that both nodes are connected to their dedicated bit-lines, and that said circuitry does not drive the additional pass-transistor during a read-cycle of the memory cell so that it is switched open.

The advantages of the invention are also achieved by a method to operate a random access memory, wherein said circuitry drives the additional pass-transistor in case that instead of a complement bit-line a permanent connection to ground is present according to the data to be written, and wherein the additional pass-transistor will be driven via a generated signal only in case a 'one' is to be written. It is also possible that instead of a complement bit-line a permanent connection to the supply voltage is present and according to the data to be written the additional pass-transistor will be driven via a generated signal only in case a 'zero' is to be written.

BRIEF DESCRIPTION OF THE DRAWINGS

The present invention and its advantages are now described in conjunction with the accompanying drawings.

DETAILED DESCRIPTION

Figure 1:
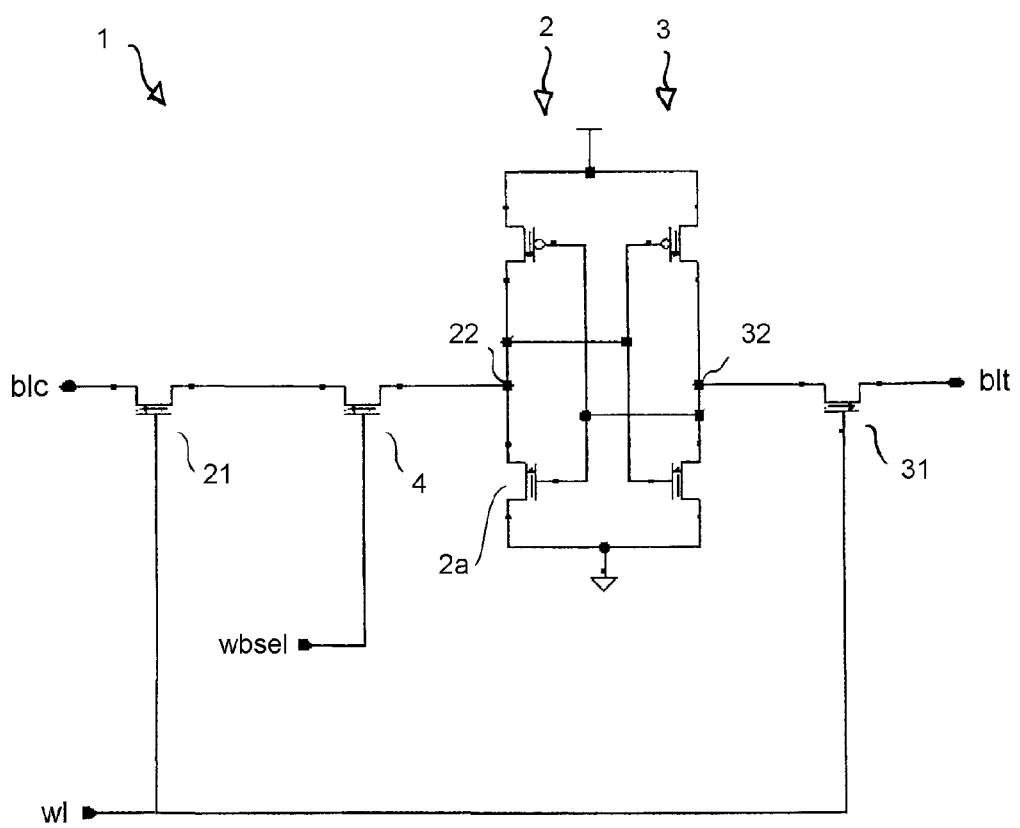
FIG. 1 is a schematic circuit block diagram of an asymmetrical random access memory cell according to the invention.

FIG. 1 shows an asymmetrical random access memory cell 1 in accordance to the invention, the asymmetrical random access memory cell 1 comprising cross coupled inverters 2 and 3 which are driven at their nodes 22 and 32 by separate bit-lines blt and blc of a pair of complementary bit-lines, which are connected via a pass-transistor 21 and 31, which are driven by a wordline wl. An additional pass-transistor 4 is provided in series connection to the pass-transistor 21; said series connection is switched between the complementary bit-line blc and the node 22 of the memory cell. The ordering of the two series-connected pass-transistors 21 and 4 is thereby arbitrary.

The random access memory cell is thereby asymmetrical by means of the cross coupled inverters 2, 3 which exhibit asymmetrical physical behaviours whereby the switching thresholds of the inverters are different.

The single wordline wl is active during read and write operations as in the 6T cell known from the state of the art, but the additional pass-transistor 4 inserted into the path between the complementary bit-line blc and node 22 is switched 'off' during read operations. In other words, pass-transistor 4 is not driven during a read operation.

This leads to the effect that during read operations no charge exchange occurs between bit-line blc and node 22. Therefore, the drive strength of the pull-down transistor 2a connected to node 22 can be safely reduced, e.g. by manipulating the transistors threshold voltage, its gate width, its gate length, and/or the thickness of its gate oxide. This shifts the threshold of the inverter driven by node 32 and, hence, improves the stability. Alternatively, the threshold of inverter 3 could be reduced.

The threshold voltage of the two series-connected pass-transistors 4 and 21 is reduced in order to achieve the same write performance as with the 6T cells according to the state of the art.

When the asymmetrical random access memory cell 1 is determined to be used in a hierarchical domino sensing environment, a local evaluation circuit is required.

Figure 2:
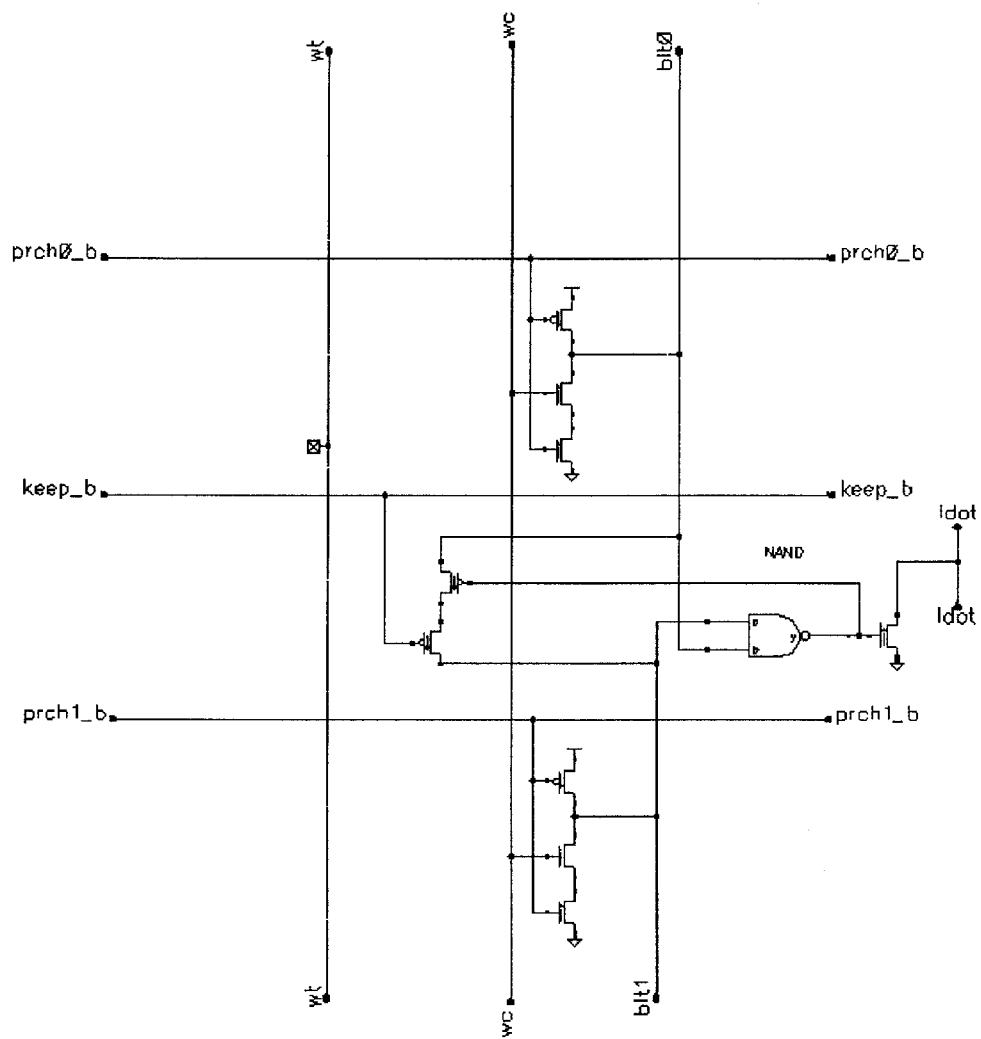
FIG. 2 is a schematic circuit block diagram of a local evaluation circuit to operate the memory cell of FIG. 1 in a hierarchical domino sensing environment.

Such a local evaluation circuit is shown in FIG. 2.

The operation and signal generation of this local evaluation circuit is described in following:

Before each read/write operation, the read/write bit-line blt0/1 is precharged to a 'high' level by means of a p-channel pull-up transistor controlled by a prch0/1_b signal. During a write operation, blt0/1 is either kept at a 'high' level (for writing a logical '1') or driven to a 'low' level by means of a n-channel pull-down transistor controlled by a write complement signal wc (for writing a logical '0'). During a read operation, blt0/1 is either kept at a 'high' level or driven to a 'low' level by the cell depending on whether a logical '1' or a logical '0', respectively, is stored in the cell. Two p-channel pass-transistors controlled by a delayed signal keep_b are added for leakage compensation at blt0/1 when otherwise floating at a 'high' level.

The write bit-line blc must be driven to a 'low' level for writing a logical '1' and to a 'high' level for writing a logical '0'.

Figure 3:
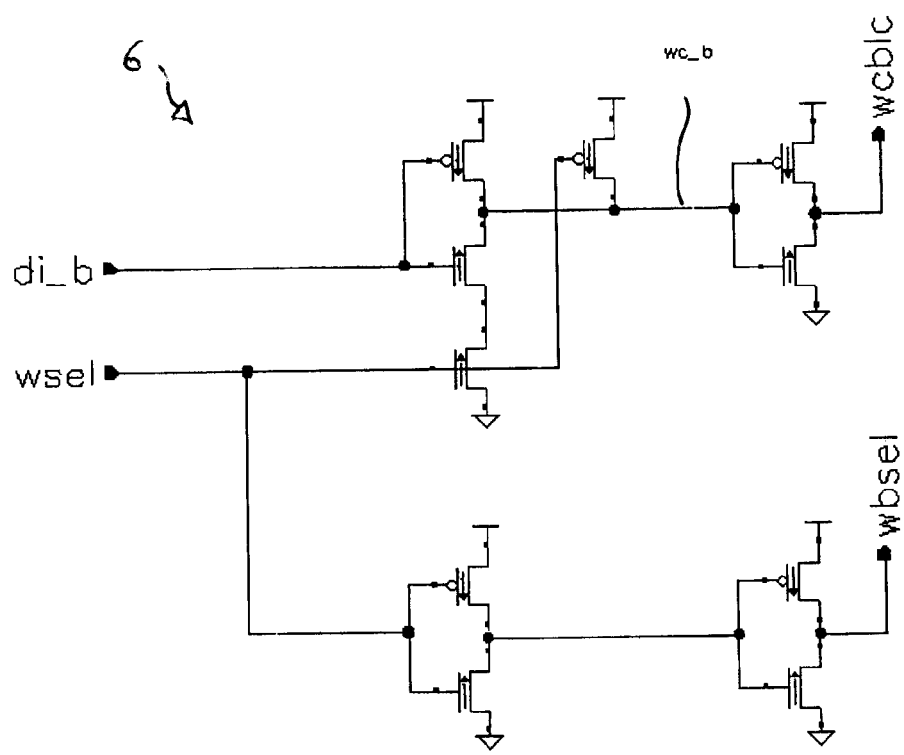
FIG. 3 is a schematic circuit block diagram of a driver circuit also generating a write bit select signal in a hierarchical domino sensing environment.

During read operations, however, the write bit-line blc may be at any state. Since the write complement signal wc must also be at a 'low' level for writing a logical '1' and at a 'high' level for writing a logical '0', the two signals can be merged into one signal 'wcblc', thus requiring only one wire and one driver circuit 6 (see FIG. 3).

The driver circuit 6 also generates a write bit select signal wbsel, which is at a 'high' level when a cell connected to this signal is to be written and at a 'low' level otherwise. Inputs to driver circuit 6 can be, for instance, data input, read/write control, and/or bit-line selection signals.

Figure 4:
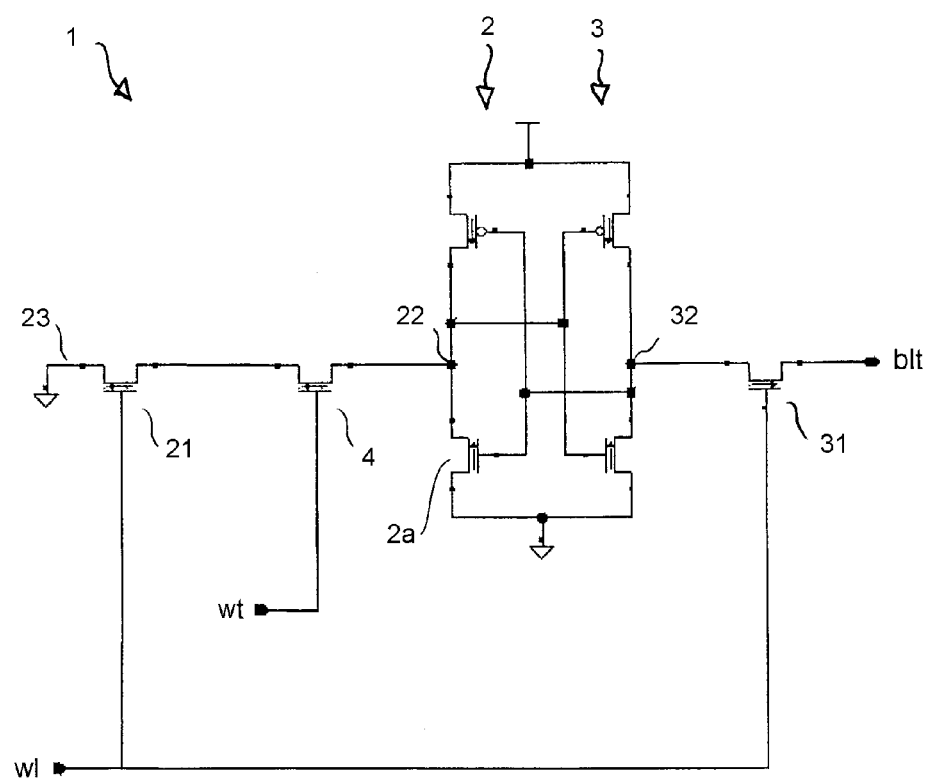
FIG. 4 is a schematic circuit block diagram of a second embodiment of the asymmetrical random access memory cell, wherein the complementary bit-line is eliminated.

FIG. 4 shows a second embodiment of the asymmetrical random access memory cell, wherein the complementary write bit-line (blc) is eliminated by a permanent connection to ground 23, pulling the blc node 22 of the memory cell permanently to a 'low' level inside the memory cell. This achieves a more compact design on the chip surface, which simplifies the implementation of the memory cell at the cost of some performance degradation during write operations when writing a '0'.

Figure 5:
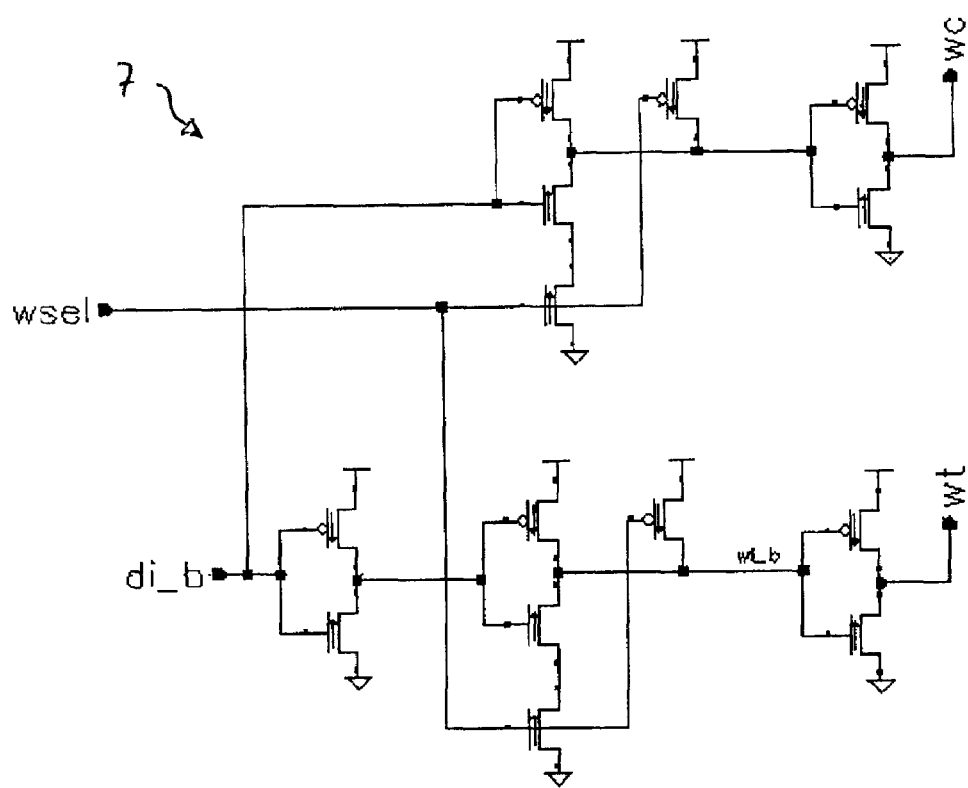
FIG. 5 is a schematic circuit block diagram of a write driver circuitry for the memory cell shown in FIG. 4.

A write driver circuit 7 for above described abbreviated memory cell is shown in FIG. 5.

The write driver circuit generates the write complement signal wc as described before for FIG. 2 and a signal wt which is at a 'high' level when a logical '1' is to be written to a cell connected to wt and at a 'low' level otherwise.

What is claimed is:

1. An asymmetrical random access memory cell (1) comprising:
   a first cross coupled inverter (2) having a first node (22);
   a second cross coupled inverter (3) having a second node (32);
   a pair of complementary bit-lines comprising a first bit-line blc), the first bit-line coupled to the first node; and a second bit line (blt), the second bit-line coupled to the second node;
   the first bit-line being coupled to a first pass-transistor (21);
   the second bit-line being coupled to a second pass-transistor (31); wherein, the first cross coupled inverter (2) comprises a different switching threshold than the second cross coupled inverter such that the first and second cross coupled inverters provide asymmetrical physical behaviours; and wherein the third pass-transistor (4) is coupled in series to the first pass-transistor (21) between the first node and the first bit-line (blc).

2. The asymmetrical random access memory cell according to claim 1 wherein, the first and third pass-transistors (21, 4) each have a lower threshold voltage than the second pass-transistor (31).

3. The asymmetrical random access memory cell according to claim 1, wherein, the first and second pass-transistors (21, 31) are each driven by a single word-line (wl).

4. The asymmetrical random access memory cell according to claim 1, wherein the third pass-transistor (4) is coupled to a write select line (wbsel) which is generated by a driver circuit (6), the write select line drives the third pass-transistor during a write operation and does not drive the third pass-transistor during a read operation.

5. The asymmetrical random access memory cell according to claim 1, wherein, the first bit-line (blc) is coupled to ground.

6. The asymmetrical random access memory cell of claim 1 wherein the first bit-line (blc) is coupled to a supply voltage.

7. A random access memory comprising a plurality of asymmetrical random access memory cells; the plurality of asymmetrical random access memory cells each comprising:
   a first cross coupled inverter (2) having a first node (22);
   a second cross coupled inverter (3) having a second node (32);
   a pair of complementary bit-lines comprising a first bit-line (blc), the first bit-line coupled to the first node; and a second bit line (blt), the second bit-line coupled to the second node;
   the first bit-line being coupled to a first pass-transistor (21);
   the second bit-line being coupled to a second pass-transistor (31); wherein, the first cross coupled inverter (2) comprises a different switching threshold than the second cross coupled inverter such that the first and second cross coupled inverters exhibit asymmetrical physical behaviours; and
   wherein a third pass-transistor (4) is coupled in series to the first pass-transistor (21) between the first node and the first bit-line (blc); wherein the plurality of asymmetrical random access memory cells are arranged in a plurality of columns and a plurality of rows; and wherein a driver circuit is provided to control each of the third pass-transistors (4).

8. The asymmetrical random access memory according to claim 7, wherein, the first bit-line (blc) of at least one of the random access memory cells is coupled to ground.

9. The asymmetrical random access memory according to claim 7, wherein the first bit-line (blc) of at least one of the random access memory cells is coupled to a supply voltage.

10. A method of operating a random access memory comprising the steps of:
    providing a plurality of asymmetrical random access memory cells arranged in a plurality of rows and a plurality of columns;
    the asymmetrical random access memory cells each comprising a first cross coupled inverter (2) having a first node (22);
    a second cross coupled inverter (3) having a second node (32);
    a pair of complementary bit-lines comprising a first bit-line (blc), the first bit-line coupled to the first node; and a second bit line (blt), the second bit-line coupled to the second node;
    the first bit-line being coupled to a first pass-transistor (21);
    the second bit-line being coupled to a second pass-transistor (31); wherein, the first cross coupled inverter (2) comprises a different switching threshold than the second cross coupled inverter such that the first and second cross coupled inverters exhibit asymmetrical physical behaviours; and wherein a third pass-transistor (4) is coupled in series to the first pass-transistor (21) between the first node and the first bit-line (blc); and wherein a driver circuit is provided to drive the third pass-transistor (4); driving the third pass-transistor (4) during a write-cycle of a memory cell so that the first and second nodes (22, 32) are connected to the first and second bit-lines (blc, blt) respectively; and wherein the driver circuit does not drive the third pass-transistor (4) during a read-cycle of the memory cell.

11. A method of operating a random access memory according to claim 10, wherein when the first bit-line is coupled ground the driver circuit (6) drives the third pass-transistor (4), and when a 'one' is to be written to the random access memory the third pass-transistor (4) is driven by a write driver circuit (7) which generates a signal (wt).

* * * * *